United States Patent
Kim et al.

(10) Patent No.: US 11,276,633 B2
(45) Date of Patent: Mar. 15, 2022

(54) SEMICONDUCTOR PACKAGE HAVING UBM PAD WITH GAP SEPARATING CENTRAL PORTION FROM PERIPHERAL PORTION

(71) Applicant: SAMSUNG ELECTRONICS CO., LTD., Suwon-si (KR)

(72) Inventors: Gayoung Kim, Hwaseong-si (KR); Duckgyu Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/905,560

(22) Filed: Jun. 18, 2020

(65) Prior Publication Data

US 2021/0151369 A1    May 20, 2021

(30) Foreign Application Priority Data

Nov. 14, 2019   (KR) .......................... 10-2019-0145924

(51) Int. Cl.
*H01L 23/498* (2006.01)
*H01L 23/31* (2006.01)

(52) U.S. Cl.
CPC .... *H01L 23/49816* (2013.01); *H01L 23/3114* (2013.01); *H01L 23/49822* (2013.01); *H01L 23/49838* (2013.01)

(58) Field of Classification Search
CPC ......... H01L 23/49816; H01L 23/49838; H01L 23/49822; H01L 23/562; H01L 23/522; H01L 23/3114
See application file for complete search history.

(56) References Cited

U.S. PATENT DOCUMENTS

| | | | |
|---|---|---|---|
| 7,495,317 B2 * | 2/2009 | Song ....................... | H01L 24/11 257/659 |
| 8,937,388 B2 | 1/2015 | Wu et al. | |
| 9,793,231 B2 | 10/2017 | Chen et al. | |
| 10,147,692 B2 * | 12/2018 | Chen ...................... | H01L 24/11 |
| 10,163,827 B1 * | 12/2018 | Tsao ....................... | H01L 25/50 |
| 2002/0093091 A1 | 7/2002 | Huang et al. | |
| 2005/0087885 A1 * | 4/2005 | Jeong ..................... | H01L 24/13 257/778 |
| 2009/0160052 A1 | 6/2009 | Yang et al. | |
| 2018/0026002 A1 * | 1/2018 | Chen ...................... | H01L 24/03 257/738 |
| 2018/0374769 A1 | 12/2018 | Fehler et al. | |
| 2019/0074255 A1 * | 3/2019 | Chen .................. | H01L 23/3114 |
| 2019/0348352 A1 * | 11/2019 | Huang ................ | H01L 23/3128 |

* cited by examiner

*Primary Examiner* — Michael Jung
(74) *Attorney, Agent, or Firm* — Volentine, Whitt & Francos, PLLC

(57) ABSTRACT

A semiconductor package includes; a semiconductor chip, a conductive pattern electrically connected to the semiconductor chip, a pad electrically connected to the conductive pattern, and a connection member disposed on and electrically connected to the pad. The pad includes a central portion and a peripheral portion at least partially surrounding the central portion and separated from the peripheral portion by a gap, and the connection member contacts at least one of a side surface of the central portion and an inner side surface of the peripheral portion.

20 Claims, 22 Drawing Sheets

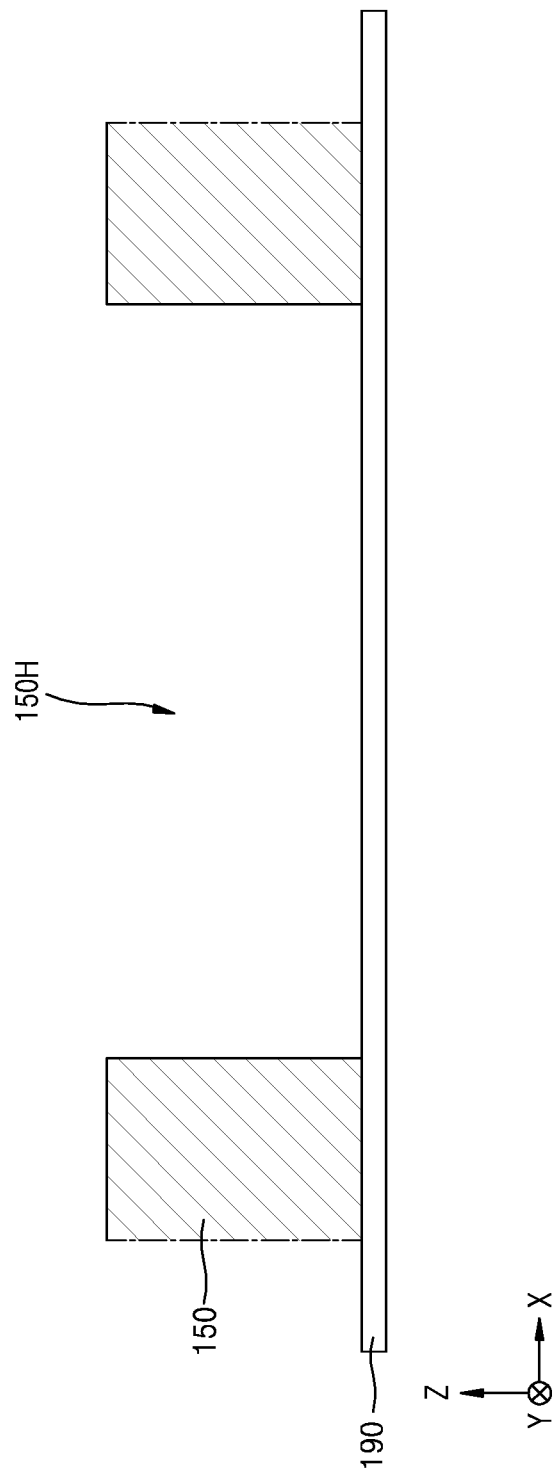

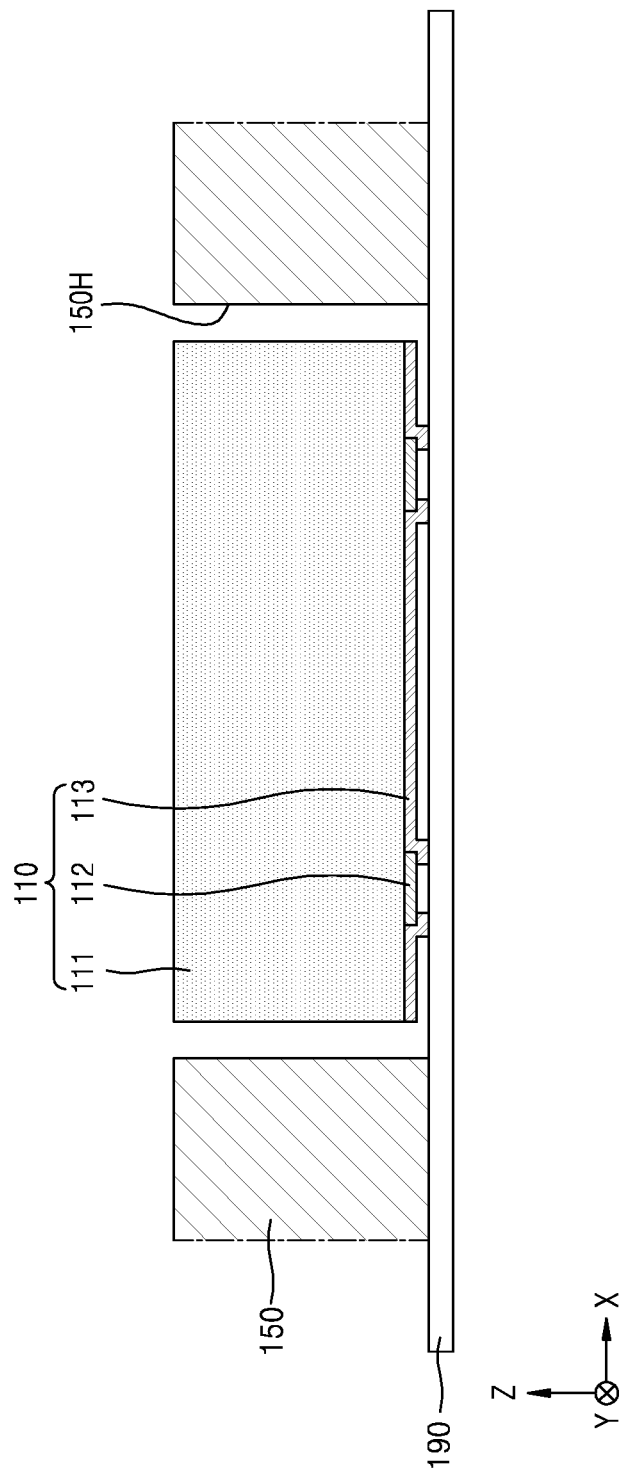

SEMICONDUCTOR PACKAGE HAVING UBM PAD WITH GAP SEPARATING CENTRAL PORTION FROM PERIPHERAL PORTION

CROSS-REFERENCE TO RELATED APPLICATION

This application claims the benefit of Korean Patent Application No. 10-2019-0145924, filed on Nov. 14, 2019 in the Korean Intellectual Property Office, the subject matter of which is hereby incorporated by reference.

BACKGROUND

The present disclosure relates to semiconductor packages and semiconductor packaging methods. More specifically, present disclosure relates to wafer-level packages (WLP) and WLP methods.

In certain WLP packaging methods, semiconductor chips are packaged using a redistribution layer and without using a printed circuit board (PCB). As a result, semiconductor packages having reduced planar area and thickness, as well as higher operating speed and greater bandwidth may be obtained, as compared with semiconductor packages obtained via other semiconductor packaging methods.

SUMMARY

The present disclosure provides semiconductor packages having improved reliability. The present disclosure also provides semiconductor packaging methods that yield semiconductor packages having improved reliability.

According to an aspect of the present disclosure, there is provided a semiconductor package including; a semiconductor chip, a conductive pattern electrically connected to the semiconductor chip, a pad electrically connected to the conductive pattern, and a connection member disposed on and electrically connected to the pad. The pad includes a central portion and a peripheral portion at least partially surrounding the central portion and separated from the peripheral portion by a gap, and the connection member contacts at least one of a side surface of the central portion and an inner side surface of the peripheral portion.

According to an aspect of the present disclosure, there is provided semiconductor package including; a semiconductor chip, a redistribution layer disposed on the semiconductor chip, a pad disposed on and electrically connected to the redistribution layer, and a connection member disposed on and electrically connected to the pad. The pad includes a central portion and a peripheral portion at least partially surrounding the central portion and separated from the peripheral portion by a gap, and the connection member contacts at least one of a side surface of the central portion and an inner side surface of the peripheral portion.

According to an aspect of the present disclosure, there is provided a semiconductor package including; a semiconductor chip, a first insulating layer disposed on the semiconductor chip and including a first opening exposing a portion of the semiconductor chip, a first conductive pattern disposed on the first insulating layer in contact with the semiconductor chip through the first opening of the first insulating layer, a second conductive pattern electrically connected to the first conductive pattern, a second insulating layer disposed on the second conductive pattern and including a second opening exposing a portion of the second conductive pattern, a pad disposed on the second insulating layer in contact with the second conductive pattern through the second opening of the second insulating layer, and a connection member disposed on and electrically connected to the pad. The pad includes a central portion and a peripheral portion at least partially surrounding the central portion and separated from the peripheral portion by a gap, and the connection member contacts at least one of a side surface of the central portion and an inner side surface of the peripheral portion.

BRIEF DESCRIPTION OF THE DRAWINGS

Embodiments of the present disclosure may be more clearly understood upon consideration of the following detailed description taken in conjunction with the accompanying drawings in which:

FIGS. 9A, 9B, 9C, 9D, 9E, 9F, 9G, 9H, 9I, 9J, 9K, 9L and 9M (hereafter, inclusively, FIGS. 9A to 9M) are related cross-sectional views further illustrating in one example a packaging method for semiconductor packages according to embodiments.

DETAILED DESCRIPTION

Figure 1:
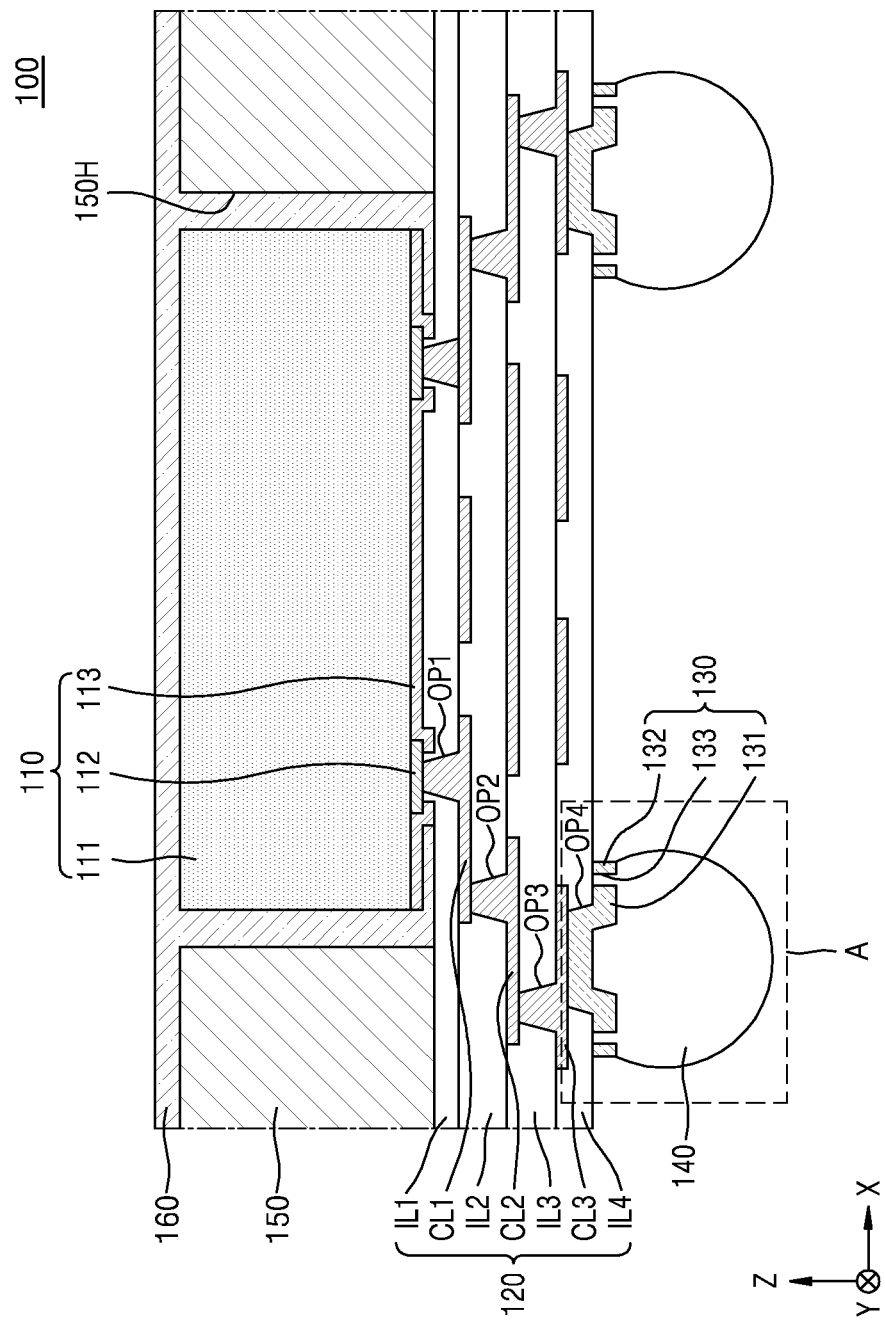
FIG. 1 is a cross-sectional view of a semiconductor package according to an embodiment.
Figure 2A:
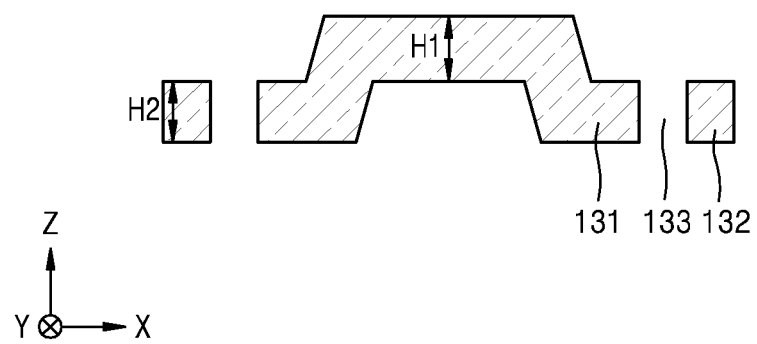
FIG. 2A is a cross-sectional view of a pad and FIG. 2B is a related plan view of the pad that may be included in a semiconductor package according to an embodiment.
Figure 2B:
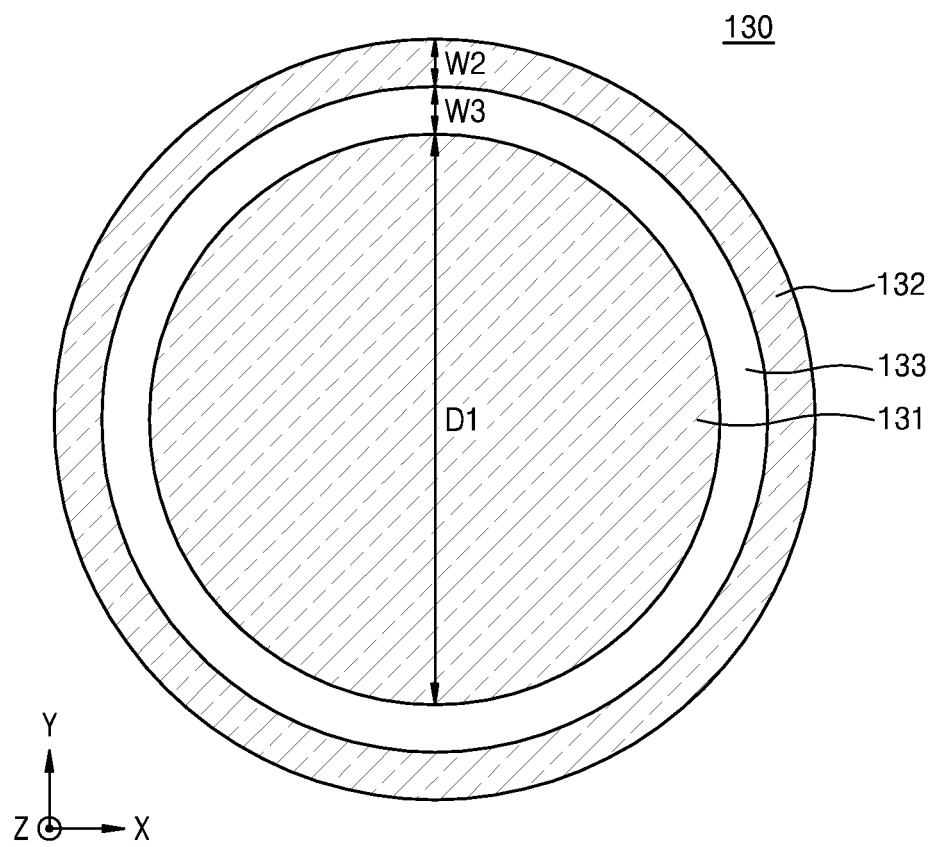

FIG. 1 is a cross-sectional view of a semiconductor package 100 according to an embodiment. FIG. 2A is a cross-sectional view of a pad and FIG. 2B is a related plan view of the pad that may be included in a semiconductor package according to an embodiment;

Referring to FIGS. 1, 2A and 2B, the semiconductor package 100 may include a semiconductor chip 110, a redistribution layer (RDL) 120 disposed on a principal surface of the semiconductor chip 110, the pad 130 disposed on the RDL 120, and a connection member 140 disposed on the pad 130. In some embodiments, the semiconductor package 100 may further include a support member 150 attached to the RDL 120. In some embodiments, the semiconductor package 100 may further include a molding layer 160 associated with the RDL 120, the semiconductor chip 110, and the support member 150.

Here, it should be noted that the RDL 120 of FIG. 1 is just one example of many different conductive pattern(s) that may be used to establish an electrical connection between the pad 130/connection member 140 and the semiconductor chip 110.

Here, the semiconductor chip 110 includes a body 111, a passivation layer 113 formed on at least a bottom surface of the body 111, and a surface pad 112 disposed on the bottom surface of the body 111 and exposed through the passivation layer 113. Thus, the semiconductor chip 110 may be understood as having an active surface (e.g., the bottom surface) and an opposing inactive surface (e.g., a top surface).

In this regard, some embodiments may be described using certain relative, geometric terms, such as bottom/top, up/down, upper/lower, left/right, higher/lower, etc. Those skilled in the art will recognize that such terms are arbitrary in nature and usually used in conjunction with the illustrated examples to better teach the making and use of the embodiments. However, the scope of the present disclosure in not limited to only the particular geometric terms used in the description.

Referring to FIG. 1, the body 111 may include an integrated circuit (IC), where the IC may include one or more of a memory circuit and a logic circuit. The memory circuit may include one or more of a dynamic random access memory (RAM) (DRAM), a static RAM (SRAM), a flash memory, an electrically erasable and programmable read-only memory (EEPROM), a phase-change RAM (PRAM), a magnetic RAM (MRAM), a resistive RAM (RRAM), etc. The logic circuit may include one or more of a central processing unit (CPU), a graphic processing unit (GPU), a controller, an application specific IC (ASIC), an application processor (AP), etc.

The IC may include one or more substrate(s). Here, a substrate may include a semiconductor material (e.g.,) a Group-IV semiconductor material, a Group III-V semiconductor material, a Group II-VI semiconductor material, or a combination thereof. The Group-IV semiconductor material may include (e.g.,) silicon (Si), germanium (Ge), or a combination thereof. The Group III-V semiconductor material may include (e.g.,) gallium arsenic (GaAs), indium phosphide (InP), gallium phosphide (GaP), indium arsenide (InAs), indium antimonide (InSb), indium gallium arsenide (InGaAs), or a combination thereof. The Group II-VI semiconductor material may include (e.g.,) zinc telluride (ZnTe), cadmium sulfide (CdS), or a combination thereof.

The surface pad 112 may be used to electrically connect the semiconductor chip 110 to another component. The surface pad 112 may be formed from one or more conductive material(s) including copper (Cu), aluminum (Al), silver (Ag), gold (Au), tungsten (W), titanium (Ti), etc. The passivation layer 113 is used to protect at least the (active) bottom surface of the body 111. Thus, the passivation layer 113 may be disposed to cover the bottom surface of the body 111 and selectively expose a portion of the bottom surface on which the surface pad 112 is disposed. In some embodiments, the passivation layer 113 may cover at least a portion of the surface pad 112. The passivation layer 113 may include one or more insulating material(s), such as an inorganic insulating material, an organic insulating material, or a combination thereof. The inorganic insulating material may be silicon oxide, silicon nitride, phosphosilicate glass (PSG), borophosphosilicate glass (BPSG), fluorosilicate glass (FSG), etc. Here, the organic insulating material may be an insulating polymer.

The RDL 120 may be disposed to provide various electrical connections to the (active) bottom surface of the semiconductor chip 110. In some embodiments, a planar area (i.e., a horizontal or lateral plane measured in the X and Y directions perpendicular to the Z (or vertical) direction) of the RDL 120 may be greater than (or extend further in at least one lateral direction) a planar area of the semiconductor chip 110. That is, the semiconductor package 100 may be a fan-out type semiconductor package.

The RDL 120 may include a plurality of insulating layers (e.g., first, second, third and fourth insulating layers IL1 to IL4) and a plurality of conductive patterns (e.g., first, second and third conductive patterns CL1 to CL3). For example, the RDL 120 may include the first to fourth insulating layer IL1 to IL4 which are vertically stacked on the active surface of the semiconductor chip 110. Here, the first conductive pattern CL1 may be disposed between the first insulating layer IL1 and the second insulating layer IL2, the second conductive pattern CL2 may be disposed between the second insulating layer IL2 and the third insulating layer IL3, and the third conductive pattern CL3 may be disposed between the third insulating layer IL3 and the fourth insulating layer IL4. Although FIG. 1 illustrates a case in which the RDL 120 includes four insulating layers (i.e., the first to fourth insulating layers IL1 to IL4) and three conductive patterns (i.e., the first to third conductive patterns CL1 to CL3), the RDL 120 may include larger or smaller numbers of insulating layers and conductive patterns than those of FIG. 1.

The first to third conductive patterns CL1 to CL3 of the RDL 120 may be used to variously connect the surface pad 112 of the semiconductor chip 110 to the pad 130. For example, the first insulating layer IL1 may be disposed on the active surface of the semiconductor chip 110 and include a first opening OP1 exposing at least a portion of the surface pad 112 of the semiconductor chip 110. The first conductive pattern CL1 may be disposed on the first insulating layer IL1 and in contact with the surface pad 112 of the semiconductor chip 110 through the first opening OP1 of the first insulating layer IL1. The second insulating layer IL2 may be disposed on the first conductive pattern CL1 and the first insulating layer IL1 and include a second opening OP2 exposing at least a portion of the first conductive pattern CL1. The second conductive pattern CL2 may be disposed on the second insulating layer IL2 and in contact with the first conductive pattern CL1 through the second opening OP2 of the second insulating layer IL2. The third insulating layer IL3 may be disposed on the second conductive pattern CL2 and the second insulating layer IL2 and including a third opening OP3 exposing at least a portion of the second conductive pattern CL2. The third conductive pattern CL3 may be disposed on the third insulating layer IL3 and in contact with the second conductive pattern CL2 through the third opening OP3 of the third insulating layer IL3. The fourth insulating layer IL4 may be disposed on the third conductive pattern CL3 and the third insulating layer IL3 and include a fourth opening OP4 exposing at least a portion of the third conductive pattern CL3.

The first to fourth insulating layers IL1 to IL4 of the RDL 120 may include (e.g.,) an insulating material including an inorganic insulating material, an organic insulating material, or a combination thereof. The inorganic insulating material may be silicon oxide, silicon nitride, PSG, BPSG, FSG, or a combination thereof, and the organic insulating material may be an insulating polymer. In some embodiments, the first to fourth insulating layers IL1 to IL4 may be formed using a photosensitive material (e.g.,) a photosensitive polyimide. When the first to fourth insulating layers IL1 to IL4 are formed using the photosensitive material, the first to fourth openings OP1 to OP4 may be easily formed in the first to fourth insulating layers IL1 to IL4. The first to third conductive patterns CL1 to CL3 of the RDL 120 may include (e.g.,) a conductive material including copper (Cu), aluminum (Al), silver (Ag), gold (Au), tungsten (W), titanium (Ti), or a combination thereof.

The pad 130 may be disposed on a lowermost conductive pattern (e.g., the third conductive pattern CL3 in FIG. 1) of the RDL 120. The pad 130 may include a central portion 131 and a peripheral portion 132 at least partially surrounding the central portion 131. In this regard, the peripheral portion 132 may at least partially surround the central portion 131 in a horizontal or lateral plane relative to a substantially vertical disposition of the pad 130 and connection member 140 to the RDL 120 and semiconductor chip 110. Further in this regard, the at least partially surrounding peripheral portion 132 may be separated (or spaced apart) from the central portion 131 by an intervening gap 133. The central portion 131 may be formed with a variety of arbitrary shapes. However, in some embodiments, the central portion 131 may have a substantially circular shape disposed in the horizontal (or lateral) plane. Here, it should be noted that the term "substantially circular shape" covers a variety of shapes beyond a perfectly circular shape, and in particular reads on non-circular (or malformed circular) variations of the circular shape due to variations in manufacturing.

Referring to FIG. 2B, a diameter D1 (e.g., a first width) of the central portion 131 may range from about 100 µm to about 500 µm (e.g., from about 200 µm to about 250 µm). However, in other embodiments, the diameter D1 of the central portion 131 may be less than 100 µm, or greater than 500 µm. A reduction in the diameter D1 of the central portion 131 may be advantageous in reducing the lateral planar area occupied by the semiconductor package 100, but may be disadvantageous in that a contact area between the pad 130 and the connection member 140 may be reduced.

In some embodiments, the peripheral portion 132 may extend at least partially around the circumference of the central portion 131. In some embodiments, the peripheral portion 132 may have a substantially constant annular width (e.g., second width W2) as it extends around the circumference of the central portion 131. Thus, the peripheral portion 132 may be formed with (or be designed to have) a constant annular shape at least partially surrounding the central portion 131. However, those skilled in the art will recognize that manufacturing variations may cause the annular width of the peripheral portion 132 to vary somewhat. Accordingly, the term "constant annular width" as used herein is not limited to only perfect (or non-varying) annular widths for an annularly shaped peripheral portion 132.

In some embodiments, the second width W2 of the peripheral portion 132 may range from about 10 µm to about 50 µm. However, in other embodiments, the second width W2 of the peripheral portion 132 may be less than 10 µm, or greater than 50 µm. A reduction in the second width W2 of the peripheral portion 132 may be advantageous in reducing the lateral planar area occupied by the semiconductor package 100, but may be disadvantageous in that a process may increase in difficulty.

In some embodiments, the gap 133 may also extend at least partially around the circumference of the central portion 131. In some embodiments, the gap 133 may have a substantially constant annular width (e.g., a third width W3) as it extends at least partially around the circumference of the central portion 131. In other embodiments, the width of the gap 133 may vary according to variation(s) in the manufacturing of the central portion 131 and/or the peripheral portion 132.

In some embodiments, the third width W3 of the gap 133 may range from about 10 µm to about 50 µm. However, in other embodiments, the third width W3 of the gap 133 may be less than 10 µm, or greater than 50 µm. When the third width W3 of the gap 133 is less than 10 µm, a formation of the gap 133 during the manufacturing process may be difficult. When the third width W3 of the gap 133 is greater than about 50 µm, capillary pressure may be excessively reduced or the planar area of the semiconductor package 100 may be excessively increased. In some embodiments, the gap 133 may be located outside the fourth opening OP4 of the fourth insulating layer IL4 of the example illustrated in FIG. 1.

In some embodiments, a first height H1 (measured in the Z or vertical direction) of the central portion 131 may range from about 5 µm to about 50 µm. As the first height H1 of the central portion 131 increases, a contact area between the connection member 140 and a side surface of the central portion 131 and/or a contact area between the connection member 140 and an inner side surface of the peripheral portion 132 may increase. However, when the first height H1 of the central portion 131 is excessively increased, the connection member 140 may not reach a top end of the gap 133 in spite of a capillary action, and thus, the RDL 120 may not come into contact with the connection member 140. In some embodiments of the pad 130, the first height H1 of the central portion 131 may be substantially equal to a second height H2 of the peripheral portion 132.

The central portion 131 and the peripheral portion 132 of the pad 130 may include (e.g.,) a conductive material including copper (Cu), aluminum (Al), silver (Ag), gold (Au), tungsten (W), titanium (Ti), or a combination thereof. In some embodiments, the central portion 131 may have substantially the same chemical composition as the peripheral portion 132. Those skilled in the art will recognize that the term "substantially the same chemical composition" should be understood as also reading on slight variations in actual chemical composition that may arise due to variations in environmental conditions and manufacturing techniques.

As shown in FIG. 1, the connection member 140 may be disposed on the pad 130. That is, the connection member 140 may contact at least a top surface of the central portion 131 and a top surface of the peripheral portion 132. The connection member 140 may be formed using (e.g.,) a solder ball and ball-attachable flux. (See, e.g., the example illustrated in FIG. 9M, hereafter). While the connection member 140 is being formed by reflowing a solder ball, due to capillary force, the connection member 140 may also be brought into contact (through the gap 133) at least one of a side surface of the central portion 131 and an inner side surface of the peripheral portion 132. Accordingly, as compared to a case in which the pad 130 does not include the gap 133, a resulting contact area between the connection member 140 and the pad 130 may be increased, and the possibility of damage to the connection member 140 due to cracks may be reduced. Therefore, the reliability of the semiconductor package 100 may be improved.

In some embodiments, the connection member 140 may contact both side surfaces exposed by the gap 133. That is, the connection member 140 may contact both the side surface of the central portion 131 and the inner side surface of the peripheral portion 132. Thus, compared to a case in which the connection member 140 is in contact with only one side surface of the gap 133 of the pad 130, that is, as compared to a case in which the connection member 140 is in contact with only one of the side surface of the central portion 131 of the pad 130 and the inner side surface of the peripheral portion 132 of the pad 130, the contact area between the connection member 140 and the pad 130 may be further increased, and possibility of damage to the connection member 140 due to cracks may be reduced. Accordingly, the reliability of the semiconductor package 100 may be improved.

In some embodiments, the connection member 140 may extend to a top end of the gap 133 to further contact a portion of the fourth insulating layer IL4 of the RDL 120 exposed through the gap 133. Accordingly, possible damage to the connection member 140 due to cracks may be further reduced, and thus, the reliability of the semiconductor package 100 may be improved.

The support member 150 may (optionally) be used to improve the rigidity of the semiconductor package 100 and enable a top surface of the molding layer 160 to be planarly formed. The support member 150 may include a hole 150H exposing the RDL 120, and the semiconductor chip 110 may be arranged in the hole 150H of the support member 150. The support member 150 may include (e.g.,) a thermosetting resin (e.g., an epoxy resin), a thermoplastic resin (e.g., polyimide), or various insulating materials including a glass fiber composite material. When the support member 150 includes a highly rigid material, the support member 150 may reduce the warpage of the semiconductor package 100. In some embodiments, the semiconductor package 100 may further include a connection member (not shown) in the support member 150. The semiconductor package 100 described above may be utilized as a package-on-package (POP)-type semiconductor package.

The molding layer 160 may (optionally) be provided to further protect the semiconductor chip 110 and the RDL 120. The molding layer 160 may cover the RDL 120, the semiconductor chip 110, and the support member 150 and at least partially fill a space between the semiconductor chip 110 and the support member 150 and a space between the semiconductor chip 110 and the RDL 120. The molding layer 160 may include (e.g.,) a thermosetting resin, a thermoplastic resin, a ultraviolet (UV)-curable resin, or a combination thereof. The molding layer 160 may include (e.g.,) an epoxy resin, a silicone resin, or a combination thereof. The molding layer 160 may include (e.g.,) an epoxy mold compound (EMC).

Figure 3:
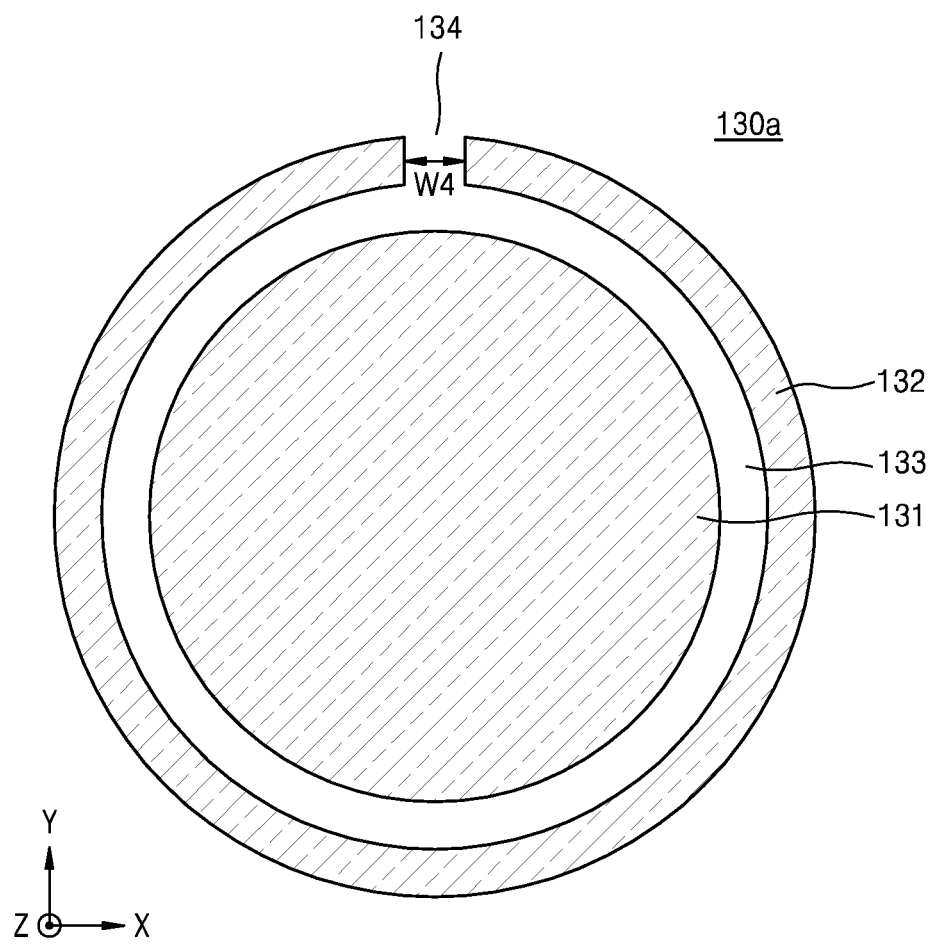
FIGS. 3 and 4 are respective plan views of a pad that may be included in a semiconductor package according to an embodiment.

FIG. 3 is a plan view of a pad 130a that may be included in a semiconductor package according to an embodiment.

Referring to FIG. 3, in contrast to the pad 130 of FIGS. 2A and 2B, the pad 130a may further include a vent hole 134 that passes through the peripheral portion 132 in an outward lateral direction from the gap 133. That is, the peripheral portion 132 may extend around less than the entire circumference of the central portion 131, and the central portion 131 may be spaced apart from the vent hole 134. Again assuming the reflow of a solder ball (e.g., one example of the connection member 140), the vent hole 134 may prevent a void from being formed in the gap 133 of the pad 130a.

Figure 4:
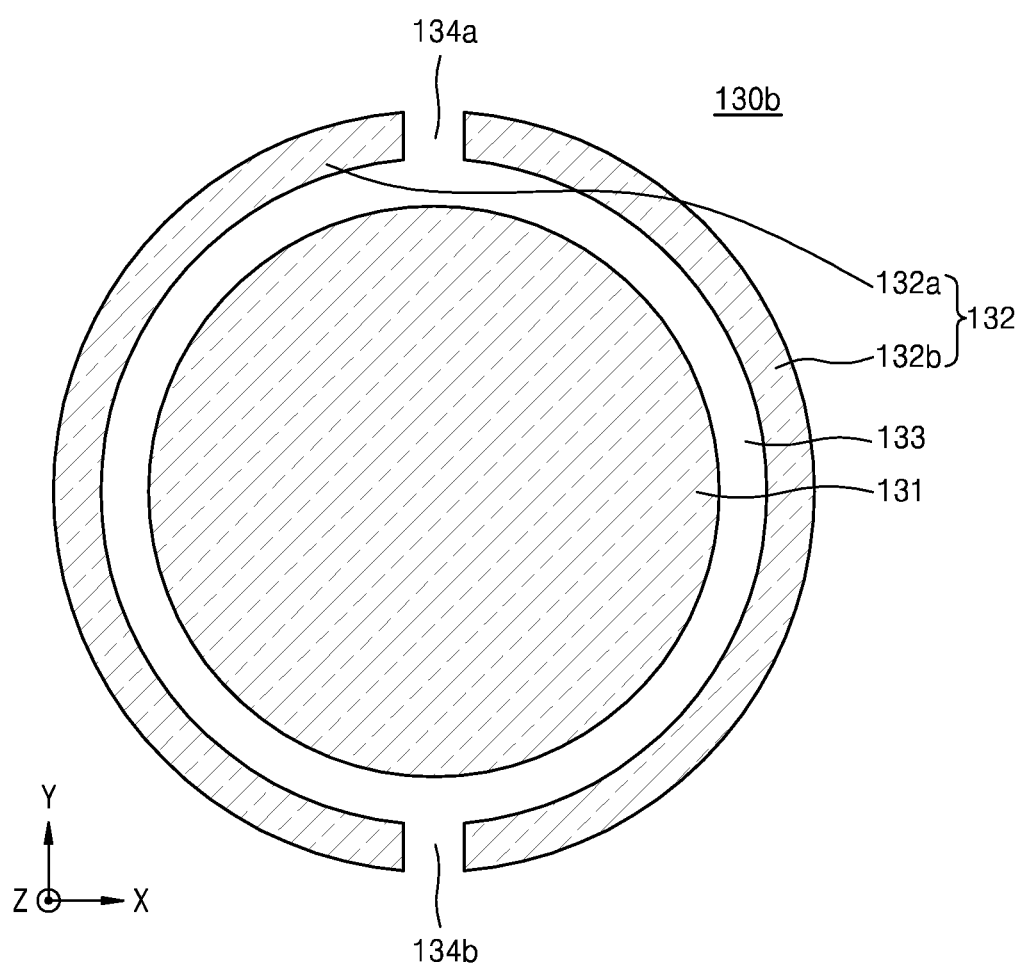

FIG. 4 is a plan view of a pad 130b that may be included in a semiconductor package according to an embodiment.

Referring to FIG. 4, the pad 130b may include a plurality of vent holes (e.g., first and second vent holes 134a and 134b) as compared with the pad 130a of FIG. 3. The peripheral portion 132 of the pad 130b may include a plurality of portions (e.g., first and second portions 132a and 132b), which are spaced apart from each other across one of the first and second vent holes 134a and 134b. For example, one end of the first portion 132a of the peripheral portion 132 may be spaced apart from one end of the second portion 132b of the peripheral portion 132 across the first vent hole 134a. Another end of the first portion 132a of the peripheral portion 132 may be spaced apart from another end of the second portion 132b of the peripheral portion 132 across the second vent hole 134b. Although FIG. 4 illustrates a case in which the first vent hole 134a directly opposes the second vent hole 134b across the central portion 131 (i.e., the first vent hole is symmetrically arranged with respect to the second vent hole 134b with respect to the central portion 131), this particular arrangement of vent holes is merely one possibility. Since the pad 130b includes a plurality of vent holes the possible formation of void(s) in the gap 133 may be more effectively prevented using the pad 130b of FIG. 4.

Figure 5A:
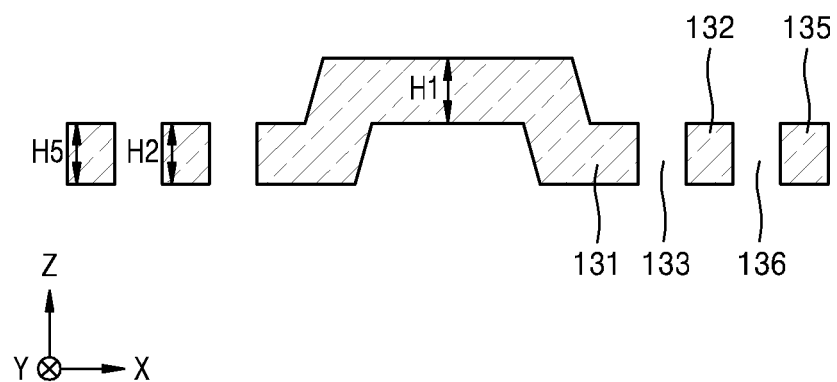
FIG. 5A is a cross-sectional view of a pad and FIG. 5B is a related plan view of the pad that may be included in a semiconductor package according to an embodiment.
Figure 5B:
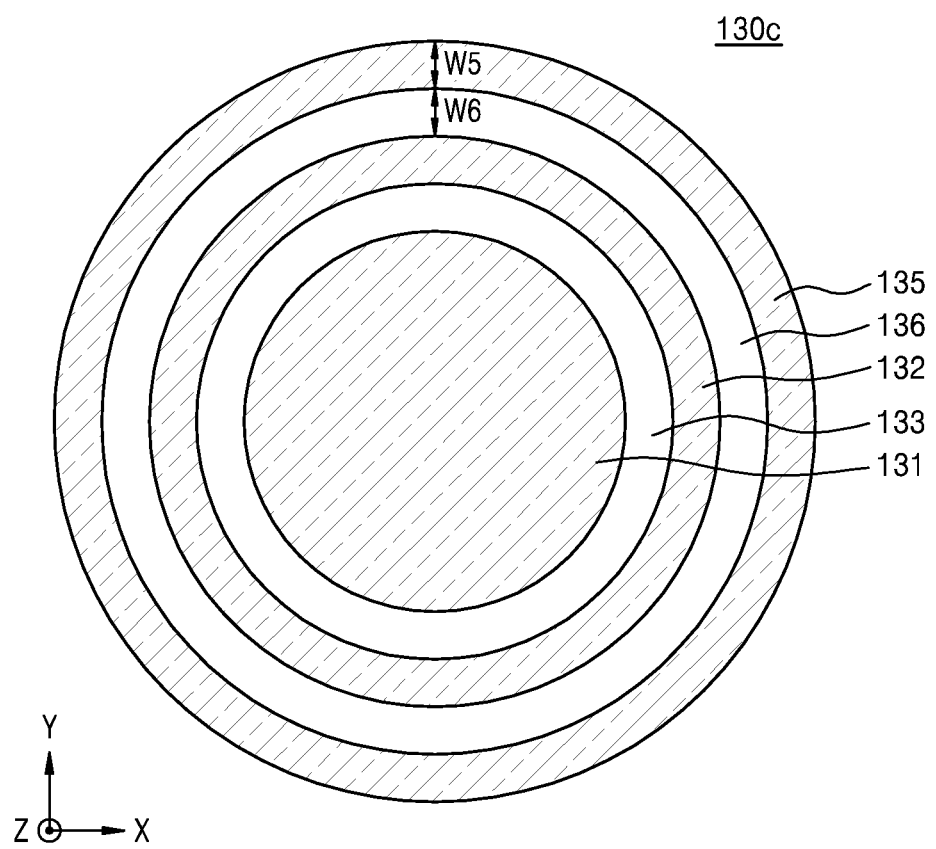

FIG. 5A is a cross-sectional view of a pad 130c and FIG. 5B is a related plan view of the pad 130c that may be included in a semiconductor package according to an embodiment;

Referring to FIGS. 5A and 5B, the pad 130c may include a central portion 131, a first peripheral portion 132 at least partially surrounding the central portion 131, and a first gap 133 between the first peripheral portion 132 and the central portion 131, a second peripheral portion 135 at least partially surrounding the first peripheral portion 132 and a second gap 136 between the second peripheral portion 135 and the first peripheral portion 132.

In some embodiments, the second peripheral portion 135 of the pad 130c may extend around the entire circumference of the first peripheral portion 132. In other embodiments, the second peripheral portion 135 of the pad 130c may extend around only a portion of the circumference of the first peripheral portion 132, and the pad 130c may further include one or more vent hole(s) that passes through the second peripheral portion 135 in a laterally outward direction from the second gap 136. (See, e.g., vent holes 134, 134a, and 134b of FIGS. 3 and 4).

In some embodiments, the second peripheral portion 135 may have a substantially constant annular width (e.g., a fifth width W5) around the circumference of the first peripheral portion 132 of the pad 130c. That is, the second peripheral portion 135 may have an annular shape surrounding the first peripheral portion 132. In other embodiments, the width of the second peripheral portion 135 of the pad 130c may not be constant.

In some embodiments, the fifth width W5 of the second peripheral portion 135 may range from about 10 μm to about 50 μm. However, in other embodiments, the fifth width W5 of the second peripheral portion 135 may be less than 10 μm, or greater than 50 μm. A reduction in the fifth width W5 of the second peripheral portion 135 may be advantageous in reducing a planar area of the semiconductor package 100, but may be disadvantageous in that a process may increase in difficulty.

In some embodiments, the second gap 136 may extend around the entire circumference of the first peripheral portion 132 of the pad 130c. In some embodiments, the second gap 136 may have a substantially constant annular width (e.g., sixth width W6) around the circumference of the first peripheral portion 132. In other embodiments, the sixth width W6 of the second gap 136 may not be constant. In some embodiments, the sixth width W6 of the second gap 136 may range from about 10 μm to about 50 μm. However, in other embodiments, the sixth width W6 of the second gap 136 may be less than 10 μm, or greater than 50 μm. When the sixth width W6 of the second gap 136 is less than 10 μm, the formation process for the second gap 136 may be difficult. When the sixth width W6 of the second gap 136 is 50 μm or more, a capillary pressure may be excessively reduced or the planar area of the semiconductor package 100 may be excessively increased. In some embodiments, the second gap 136 of the pad 130c may be disposed outside the fourth opening (e.g., OP4 of FIG. 1) of the fourth insulating layer (e.g., to IL4 of FIG. 1).

In some embodiments, a fifth height H5 of the second peripheral portion 135 may be substantially the same as the first height H1 of the central portion 131 and the second height H2 of the first peripheral portion 132. In some embodiments, the chemical composition of the second peripheral portion 135 may be substantially the same as the chemical composition of the central portion 131 and the first peripheral portion 132 of the pad 130c.

Again assuming the reflow of a solder ball, due to capillary force, the connection member 140 may be brought into contact with at least one of the side surfaces of the second gap 136. That is, at least one of an outer side surface of the first peripheral portion 132 of the pad 130c and an inner side surface of the second peripheral portion 135 of the pad 130c may be contacted by the reflowed solder ball. In some embodiments, the connection member 140 may be in contact with the both side surfaces of the second gap 136 of the pad 130c. That is, the connection member 140 may be in contact with both the outer side surface of the first peripheral portion 132 of the pad 130c and the inner side surface of the second peripheral portion 135 of the pad 130c. Since the pad 130c includes a plurality of gaps (e.g., the first and second gaps 133 and 136), a contact area between the connection member 140 and the pad 130c may be increased, and possible damage to the connection member 140 due to cracks may be reduced, thereby improving reliability of the semiconductor package 100.

In some embodiments, the connection member 140 may extend to a top end of the second gap 136 of the pad 130c and come into contact with a fourth insulating layer (e.g., IL4 of FIG. 1) of an RDL (120 of FIG. 1), exposed through the second gap 136. Accordingly, possible damage to the connection member 140 due to cracks may be reduced, thereby improving reliability of the semiconductor package 100.

Figure 6:
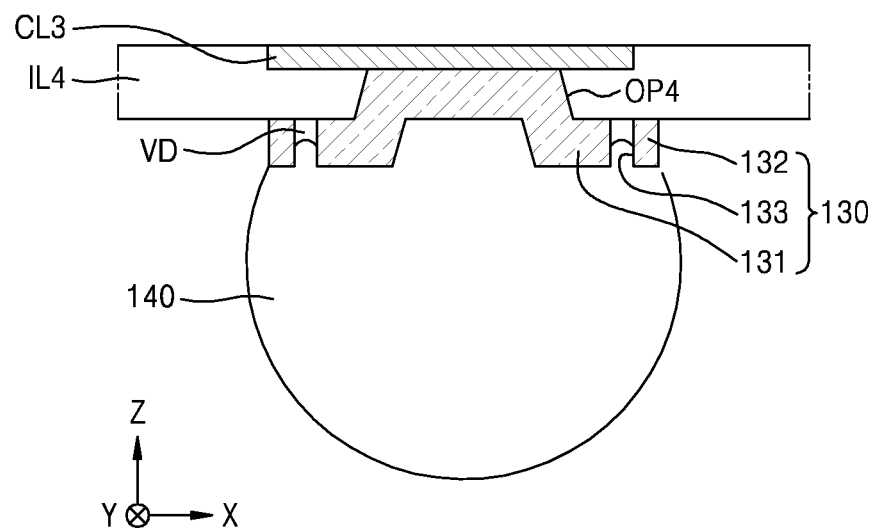
FIGS. 6 and 7 are respective, enlarged and modified diagrams showing region A of FIG. 1.

FIG. 6 is an enlarged (and modified) diagram of region A in FIG. 1.

Referring to FIG. 6, the connection member 140 may not reach a fourth insulating layer IL4 but may come into only partial contact with a side surface of a gap 133, thereby forming a void VD in the gap 133.

Figure 7:
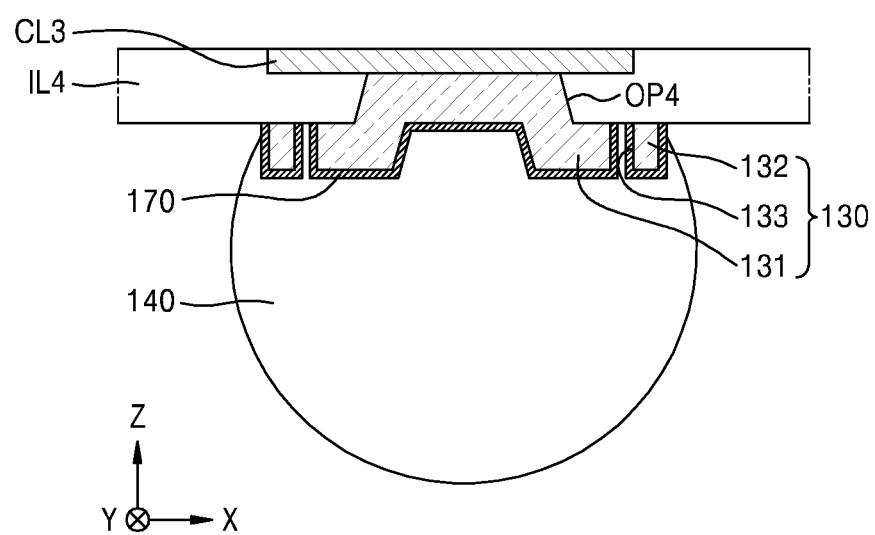

FIG. 7 is another enlarged (and modified) diagram of region A in FIG. 1.

Referring to FIG. 7, a wetting layer 170 may be disposed between the pad 130 and the connection member 140. In some embodiments, the wetting layer 170 may be disposed on a top surface and a side surface of the central portion 131, as well as on a top surface, an inner side surface, and an outer side surface of the peripheral portion 132. The wetting layer 170 may include a material capable of increasing wettability between the connection member 140 and the pad 130. For example, when the pad 130 includes copper (Cu) and the connection member 140 is formed from a solder ball, the wetting layer 170 may include gold (Au). When the connection member 140 is formed by reflowing a solder ball, the wetting layer 170 may assist the connection member 140 in coming into contact with the side surface of the central portion 131 and the outer side surface and the inner side surface of the peripheral portion 132. Accordingly, the wetting layer 170 may further reduce the possibility of damage to the connection member 140 due to cracks, thereby improving the reliability of a semiconductor package.

Figure 8:
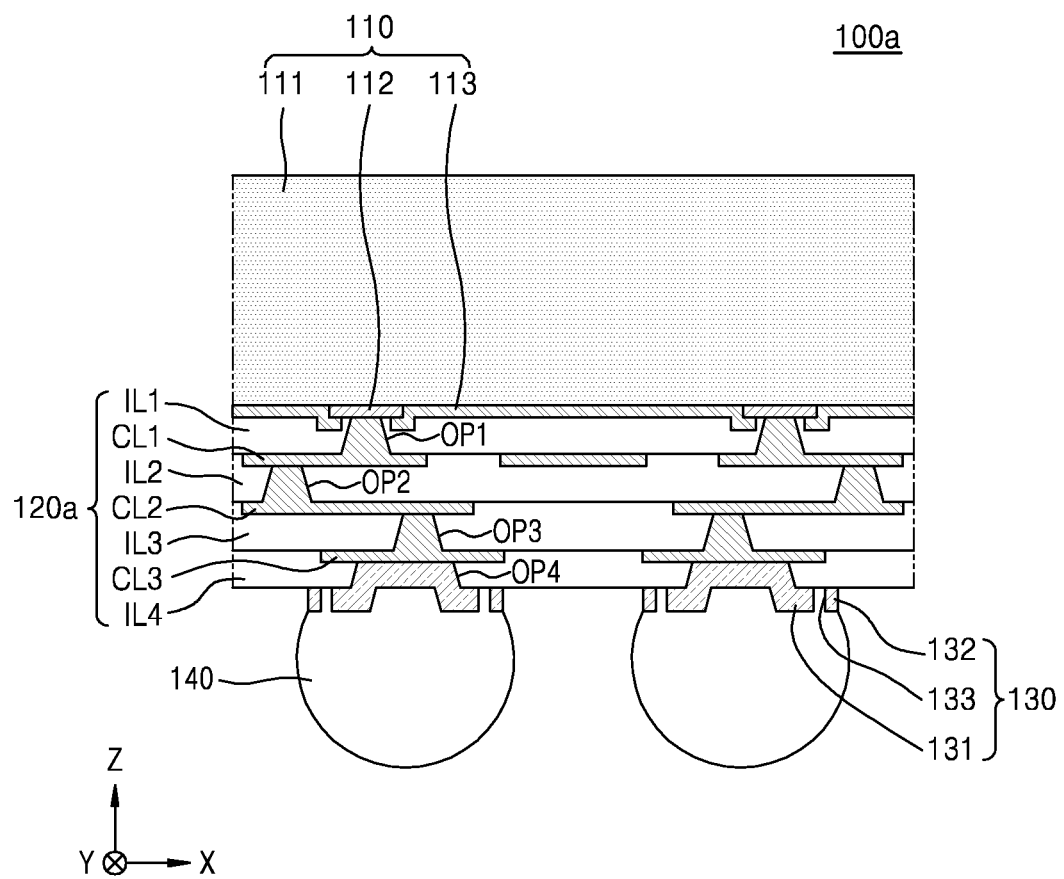
FIG. 8 is a cross-sectional view of a semiconductor package according to an embodiment.

FIG. 8 is a cross-sectional view of a semiconductor package 100a according to an embodiment.

Referring to FIG. 8, a planar area of an RDL 120a of the semiconductor package 100a may be substantially equal to a planar area of a semiconductor chip 110. That is, the semiconductor package 100a may be a fan-in type semiconductor package.

FIGS. 9A to 9M are related cross-sectional views illustrating in one example a packaging method for a semiconductor package according to an embodiment.

Referring to FIGS. 1 and 9A, a hole 150H may be formed through the support member 150. The hole 150H may be formed using (e.g.,) a mechanical drilling process, a laser drilling process, a sandblast process, a dry etching process, and/or a wet etching process. An adhesive film 190 may be adhered to one surface (e.g., a bottom surface) of the support member 150. The adhesive film 190 may include one or more material(s) capable of fixing the support member 150. The adhesive film 190 may include (e.g.,) a thermosetting adhesive tape wherein adhesion is weakened in response to the application of thermal energy or ultraviolet (UV) irradiation.

Referring to FIG. 9B, the semiconductor chip 110 may be adhered to the adhesive film 190 inside the hole 150H of the support member 150 such that the surface pad 112 and the passivation layer 113 of the semiconductor chip 110 face the adhesive film 190.

Figure 9C:
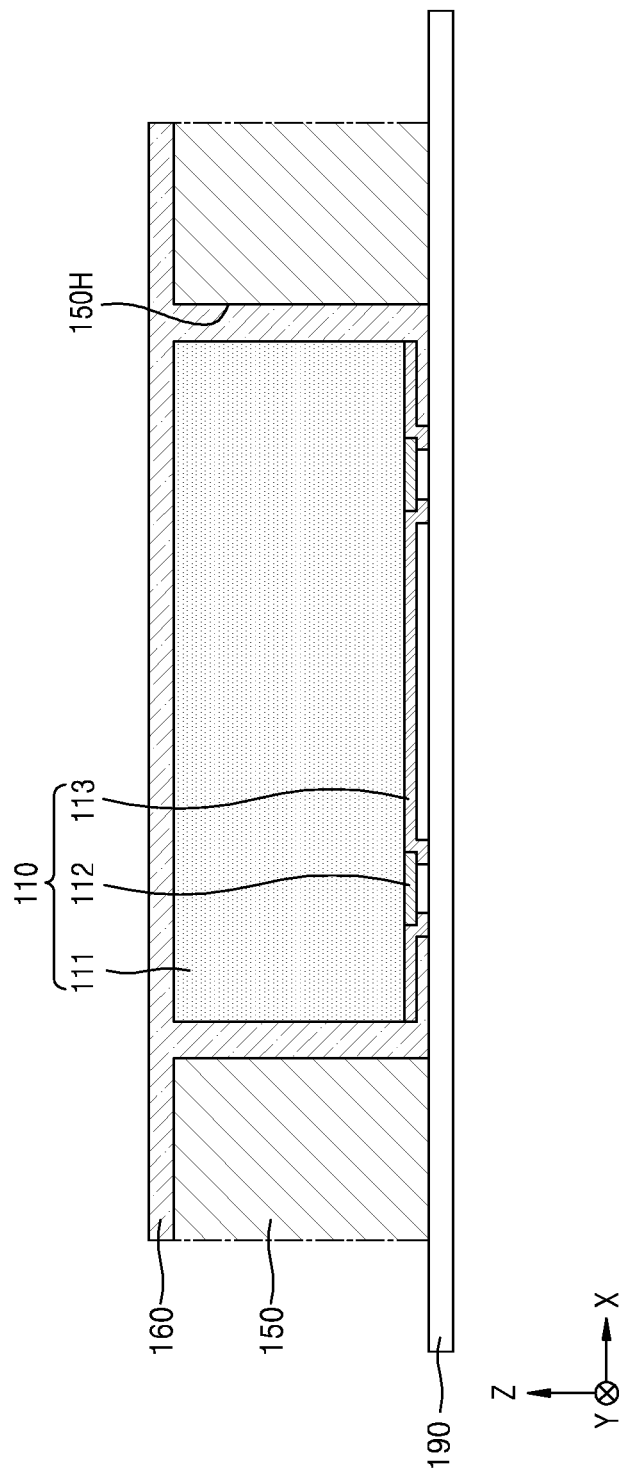

Referring to FIG. 9C, the molding layer 160 may be formed to cover the semiconductor chip 110, the support member 150, and the adhesive film 190 and at least partially fill a space between the semiconductor chip 110 and the support member 150 and a space between the semiconductor chip 110 and an RDL 120. The molding layer 160 may be formed using one of a number of known methods. For example, the molding layer 160 may be formed by laminating and curing a molding precursor. Alternatively, the semiconductor chip 110, the support member 150, and the adhesive film 190 may be coated with a liquid mold material, and the liquid molding material may be cured using heat and/or UV light to form the molding layer 160.

Figure 9D:
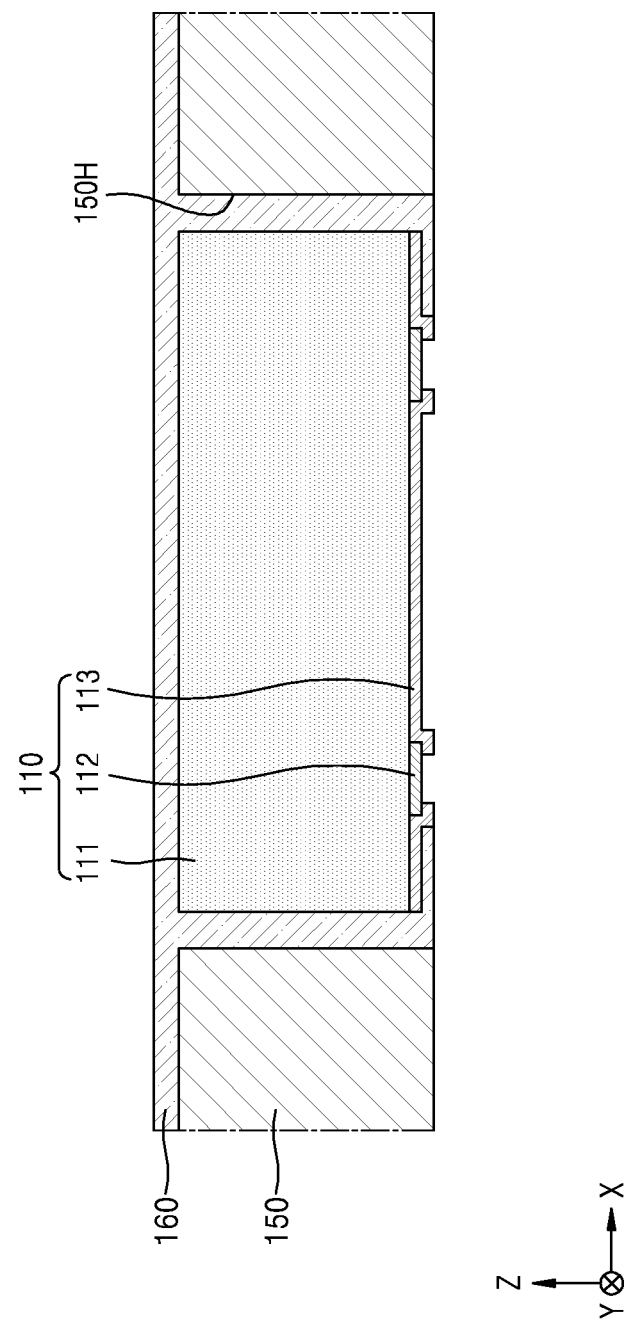

Referring to FIGS. 9C and 9D, the adhesive film 190 may be detached from the semiconductor chip 110, the support member 150, and the molding layer 160 using one of a number of known methods. For example, the adhesion of the adhesive film 190 may be weakened using heat and/or UV light, and the adhesive film 190 may be detached from the semiconductor chip 110, the support member 150, and the molding layer 160.

Figure 9E:
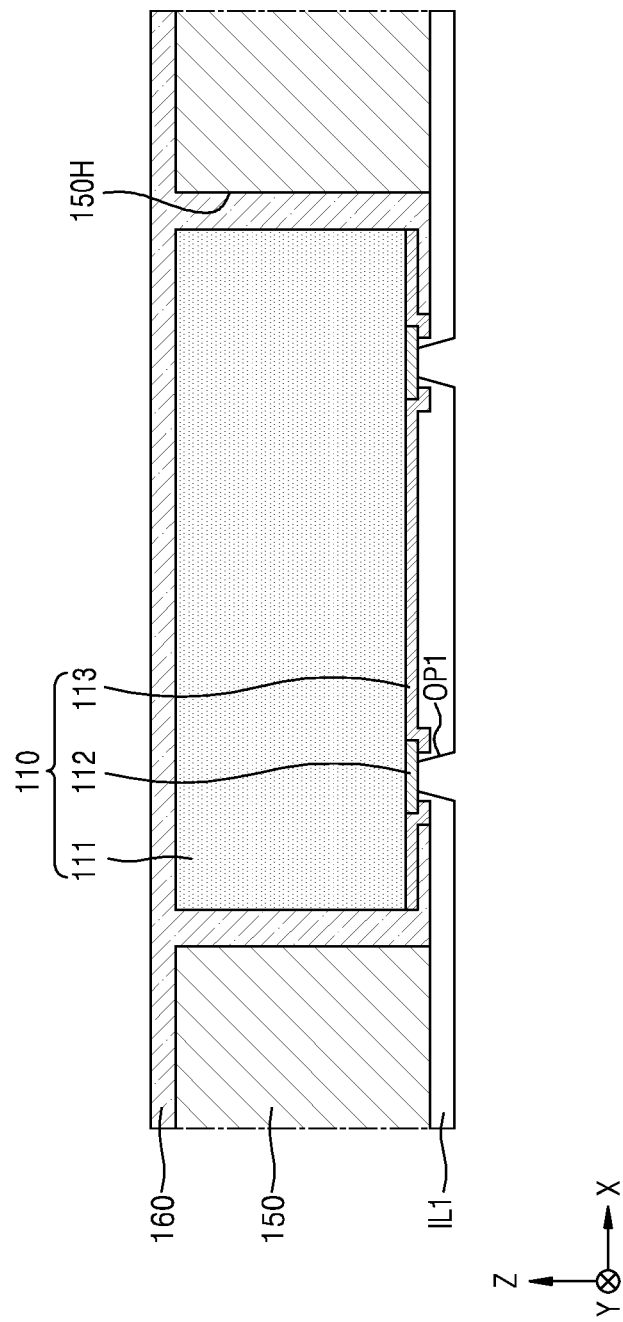

Referring to FIG. 9E, the first insulating layer IL1 may be formed on the semiconductor chip 110, the support member 150, and the molding layer 160. The first insulating layer IL1 may be formed using (e.g.,) a lamination process, a coating process a chemical vapor deposition (CVD) process, a physical vapor deposition (PVD) process, or a combination thereof. A plurality of first openings OP1 may be formed in the first insulating layer IL1 to expose at least portions of the surface pad 112. The plurality of first openings OP1 may be formed using (e.g.,) a photolithography process.

Figure 9F:
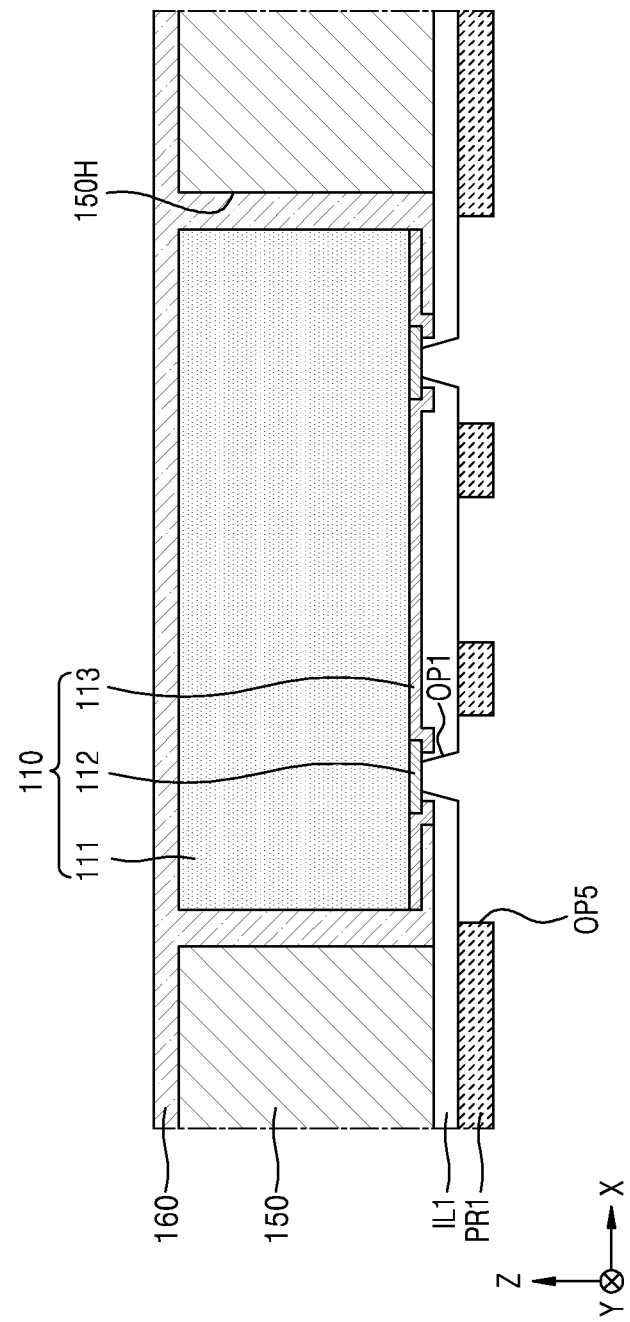

Referring to FIG. 9F, a first photoresist pattern PR1 may be formed on the first insulating layer IL1. For example, a first photoresist layer may be formed on the first insulating layer IL1 using a spin coating process, and exposure and developing processes may be performed on the first photoresist layer, and thus, the first photoresist pattern PR1 may be formed. The first photoresist pattern PR1 may include a fifth opening OP5 exposing at least a portion of the surface pad 112 and a portion of the first insulating layer IL1.

Figure 9G:
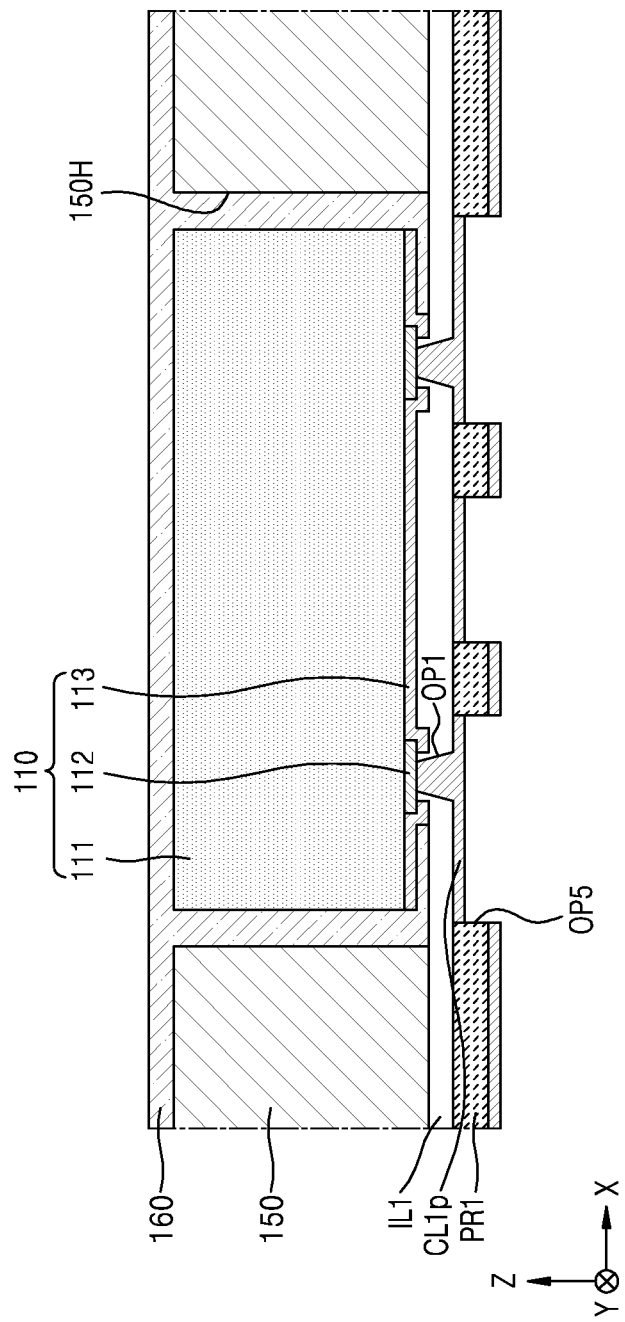

Referring to FIG. 9G, a first conductive layer CL1p may be formed on the first photoresist pattern PR1, the first insulating layer ILL and the surface pad 112. For example, the first conductive layer CL1p may be formed using a plating process, a CVD process, a PVD process, or a combination thereof.

Figure 9H:
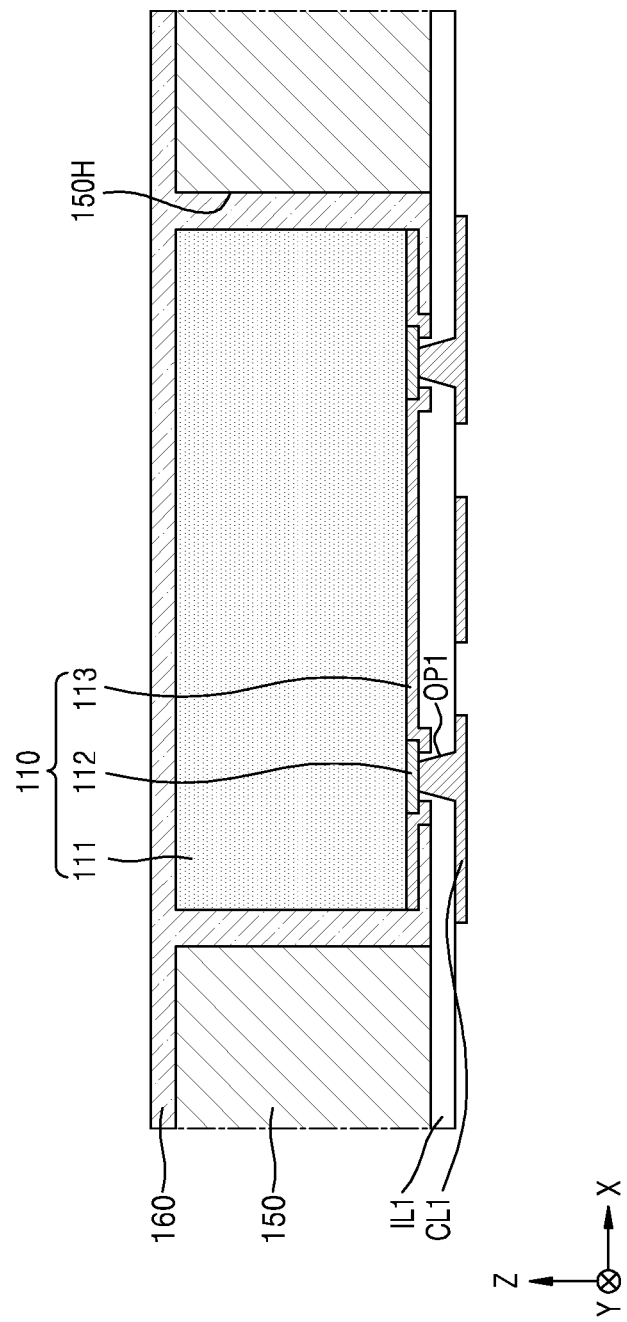

Referring to FIGS. 9G and 9H, the first photoresist pattern PR1 may be removed to form a first conductive pattern CL1.

The first photoresist pattern PR1 may be removed using (e.g.,) a wet etching process, a dry etching process, and/or an ashing process.

Figure 9I:
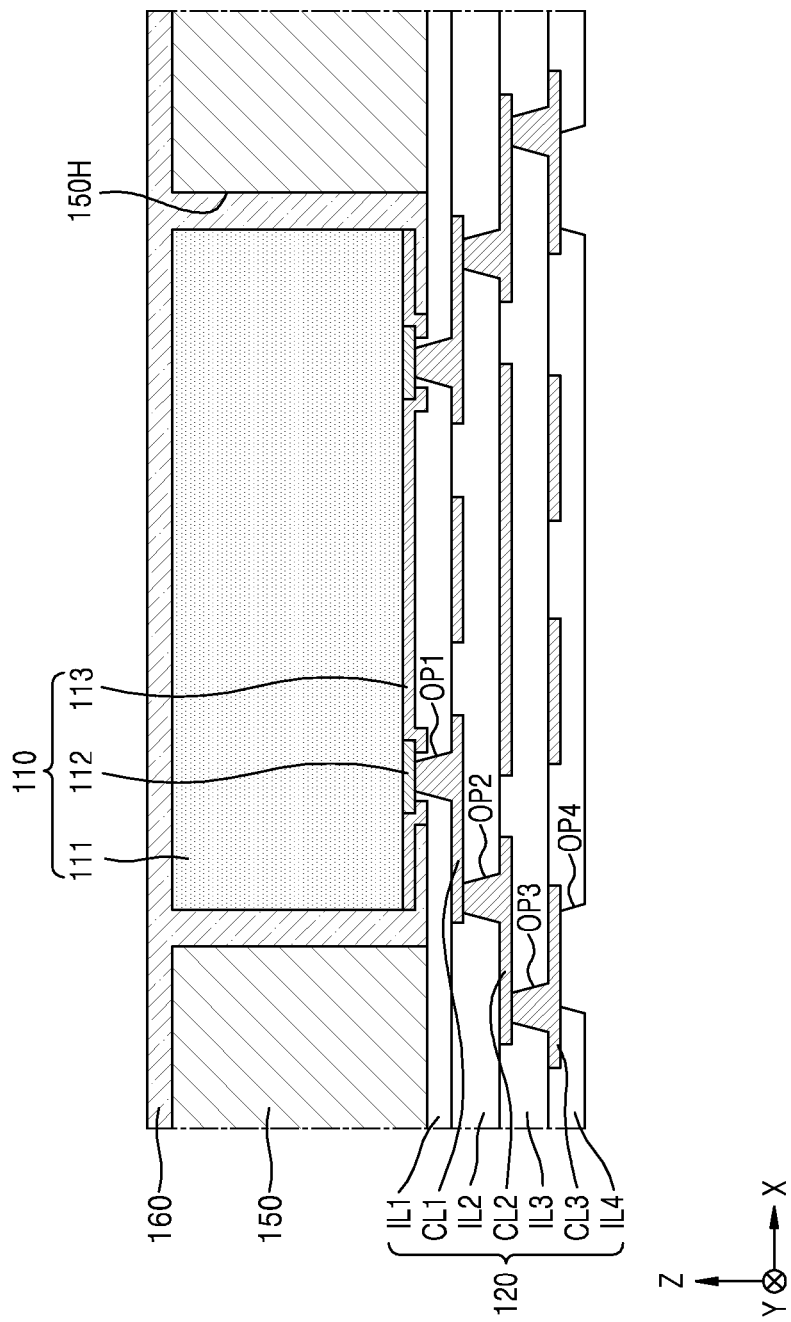

Referring to FIG. 9I, the second insulating layer IL2 may be formed on the first insulating layer IL1 using a method similar to that used to form first insulating layer ILL and a second opening OP2 may be formed in the second insulating layer IL2 exposing at least a portion of the first conductive pattern CL1. Next, a second conductive pattern CL2 may be formed on the second insulating layer IL2 and the first conductive pattern CL1 using a method similar to that used to form the first conductive pattern CL1. Afterwards, the third insulating layer IL3 may be formed on the second insulating layer IL2 using a method similar to the method used to form the first insulating layer ILL and a third opening OP3 may be formed in the third insulating layer IL3 exposing at least a portion of the second conductive pattern CL2. Next, a third conductive pattern CL3 may be formed on the third insulating layer IL3 and the second conductive pattern CL2 using a method similar to the method used to form the first conductive pattern CL1. Thereafter, the fourth insulating layer IL4 may be formed on the third insulating layer IL3 using a method similar to the method used to form the first insulating layer ILL and a fourth opening OP4 may be formed in the fourth insulating layer IL4 exposing at least a portion of the third conductive pattern CL3.

Figure 9J:
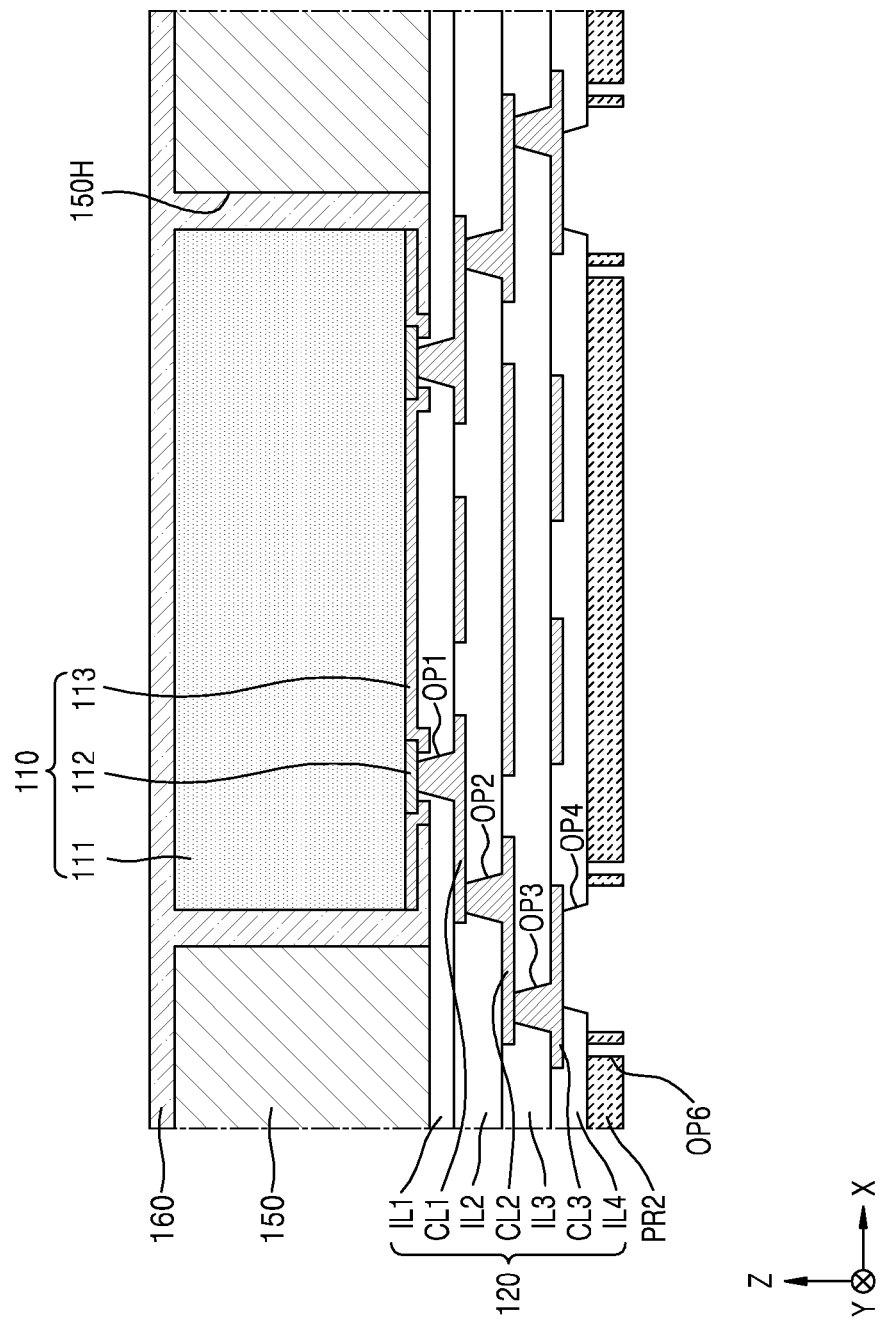

Referring to FIG. 9J, a second photoresist pattern PR2 may be formed on the fourth insulating layer IL4. For example, a second photoresist layer may be formed on the fourth insulating layer IL4 using a spin coating process, and exposure and developing processes may be performed on the second photoresist layer, and thus, the second photoresist pattern PR2 may be formed. The second photoresist pattern PR2 may include a sixth opening OP6 exposing at least portions of the third conductive pattern CL3 and the fourth insulating layer IL4.

Figure 9K:
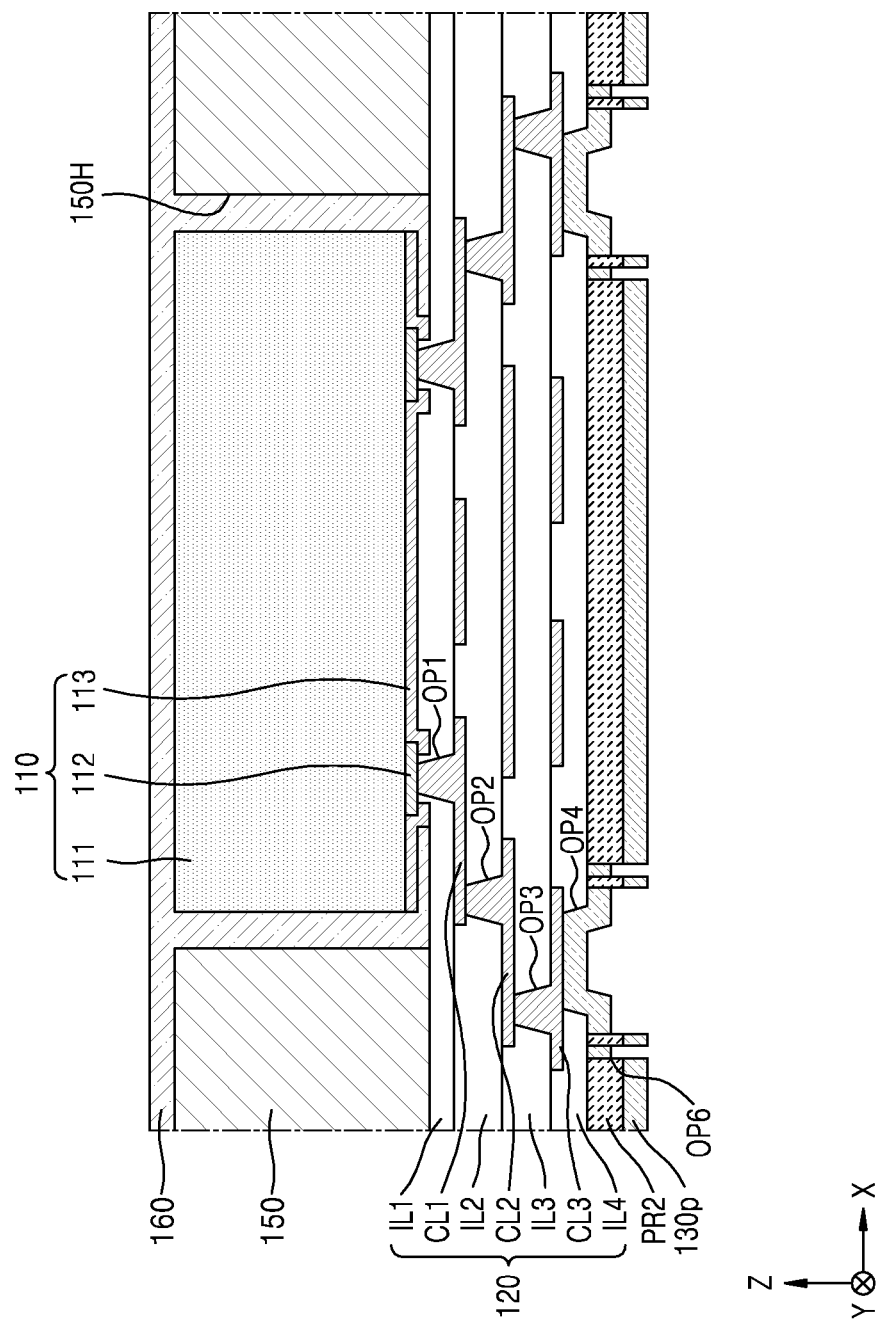

Referring to FIG. 9K, a material layer 130p may be formed on the second photoresist pattern PR2, the fourth insulating layer IL4, and the third conductive pattern CL3. For example, the material layer 130p may be formed using a plating process, a CVD process, a PVD process, or a combination thereof.

Figure 9L:
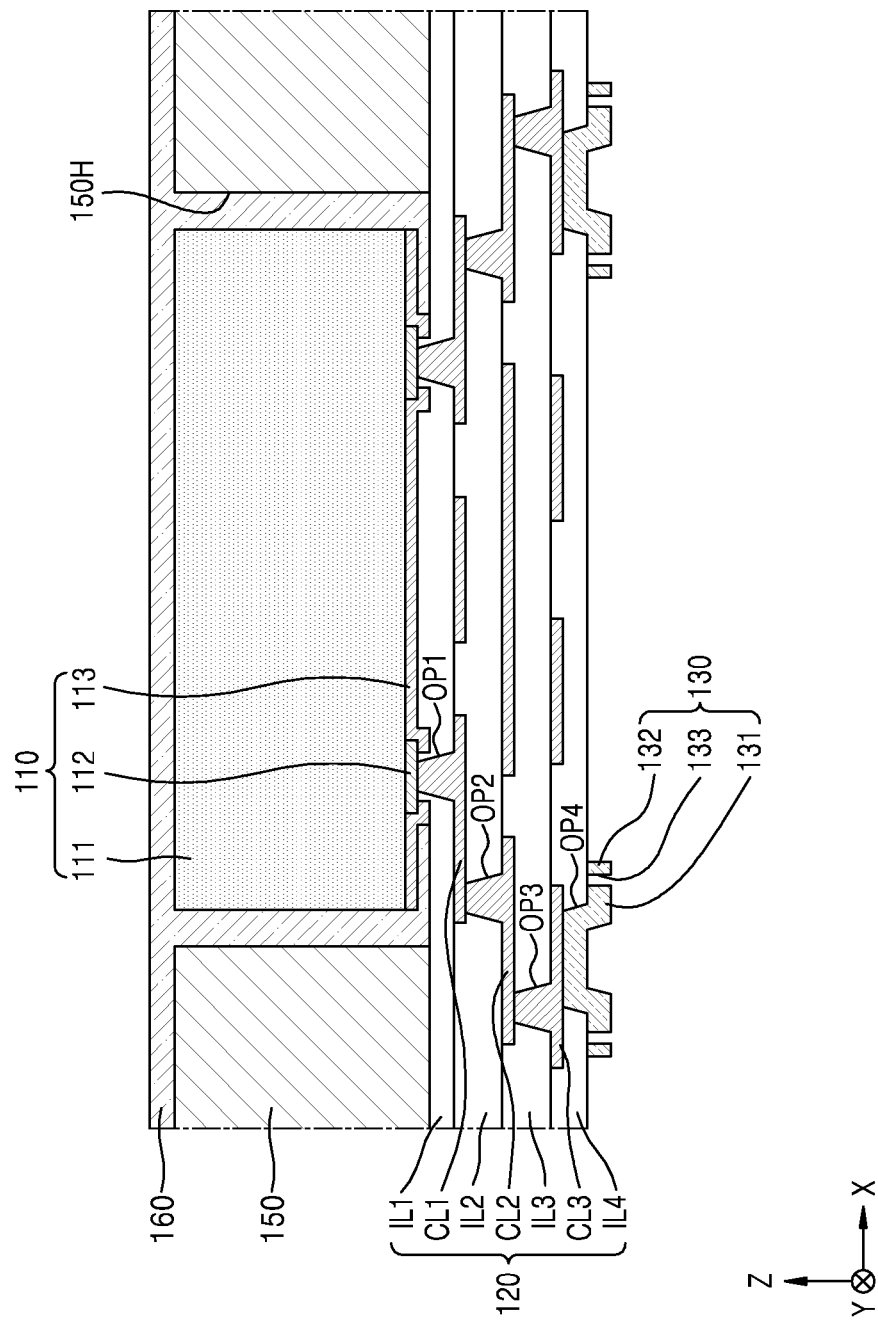

Referring to FIGS. 9K and 9L, the second photoresist pattern PR2 may be removed to form a pad 130. The second photoresist pattern PR2 may be removed using (e.g.,) a wet etching process, a dry etching process, and/or an ashing process.

As described with reference to FIGS. 9J, 9K and 9L, the central portion 131 and the peripheral portion 132 of the pad 130 may be formed simultaneously. Accordingly, since no additional process is required, the semiconductor package 100 according to the embodiment may be manufactured without a large increase in manufacturing cost. Since the central portion 131 and the peripheral portion 132 are formed simultaneously, the central portion 131 and the peripheral portion 132 of the pad 130 may have substantially the same height and chemical composition.

Figure 9M:
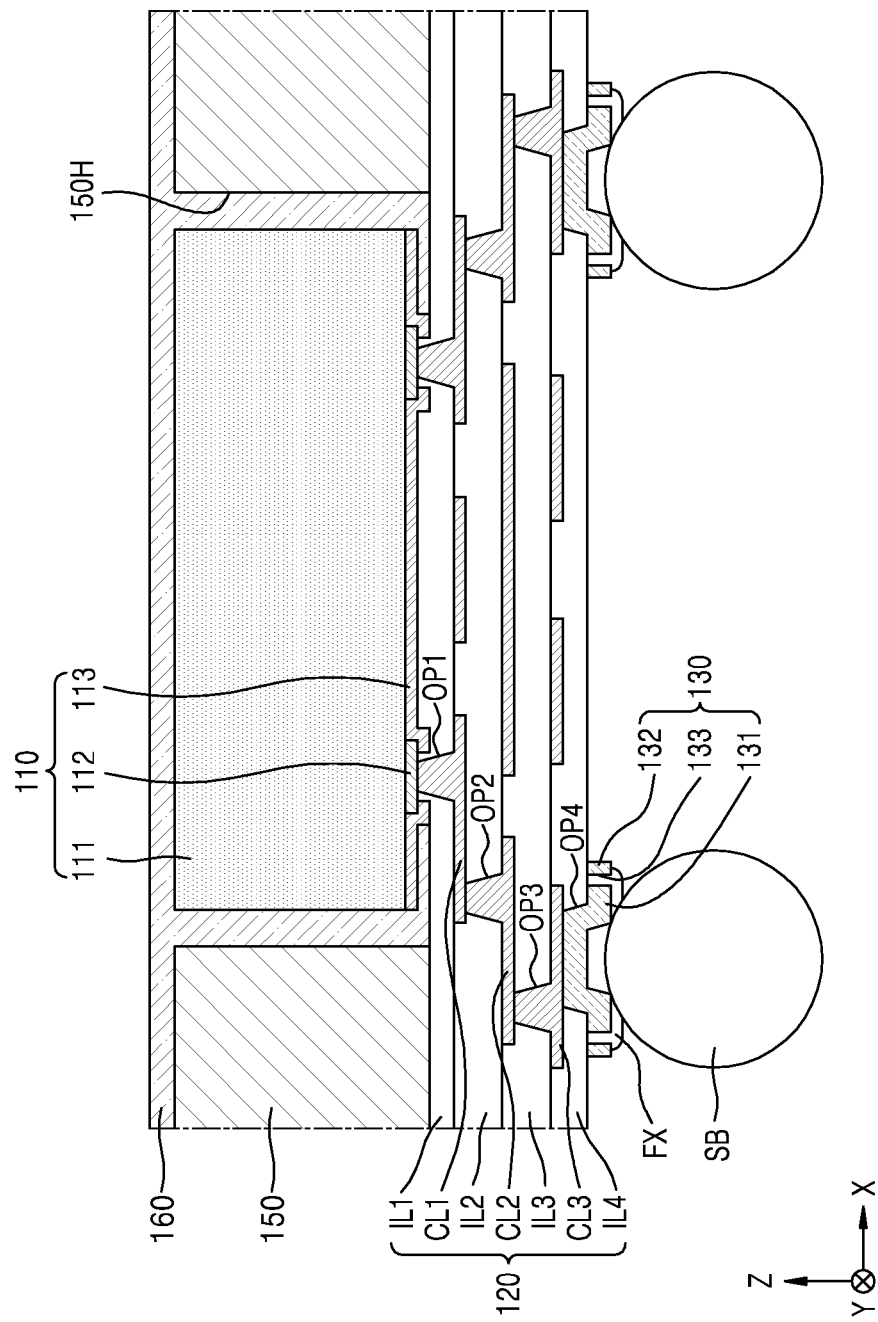

Referring to FIGS. 1 and 9M, the pad 130 may be coated with ball-attachable flux FX. In some embodiments, the ball-attachable flux FX may flow into the gap 133 of the pad 130 due to capillary action and contact with at least one of the side surfaces of the gap 133. In some embodiments, the ball-attachable flux FX may contact both side surfaces of the gap 133. In some embodiments, the ball-attachable flux FX may reach a top end of the gap 133 and contact with the fourth insulating layer IL4 of the RDL 120. In another embodiment, the ball-attachable flux FX may not flow into the gap 133 and contact only portions of the both side surfaces of the gap 133.

Next, a solder ball SB may be placed on the ball-attachable flux FX. The solder ball SB may include (e.g.,) a conductive material including tin (Sn), lead (Pb), silver (Ag), copper (Cu), or a combination thereof. Next, the solder ball SB may be reflowed to form the connection member 140 shown in FIG. 1. The connection member 140 may be brought into contact with at least one of the side surfaces of the gap 133 due to a capillary action. In some embodiments, the connection member 140 may contact both side surfaces of the gap 133. In some embodiments, the connection member 140 may extend to a top end of the gap 133 of the pad 130 and contact the forth insulating layer IL4 of the RDL 120. Thus, a contact area between the connection member 140 and the pad 130 may be increased, and possible damage to the connection member 140 due to cracks may be reduced, thereby improving reliability of the semiconductor package 100.

While the inventive concept has been particularly shown and described with reference to embodiments thereof, it will be understood that various changes in form and details may be made therein without departing from the spirit and scope of the following claims.

What is claimed is:

1. A semiconductor package comprising:
a semiconductor chip;
a conductive pattern electrically connected to the semiconductor chip;
a pad electrically connected to the conductive pattern; and
a connection member disposed on and electrically connected to the pad,
wherein the pad comprises a central portion and a peripheral portion at least partially surrounding the central portion,
the central portion separated from the peripheral portion by a gap, wherein an outer side surface of the central portion faces an inner side surface of the peripheral portion across the gap, and
the connection member physically contacts at least one of the outer side surface of the central portion and the inner side surface of the peripheral portion.

2. The semiconductor package of claim 1, wherein the connection member physically contacts the outer side surface of the central portion and the inner side surface of the peripheral portion.

3. The semiconductor package of claim 1, wherein a chemical composition of the central portion is substantially same as a chemical composition of the peripheral portion.

4. The semiconductor package of claim 1, wherein a height of the central portion is substantially equal to a height of the peripheral portion.

5. The semiconductor package of claim 1, wherein the gap has a substantially constant annular width.

6. The semiconductor package of claim 1, wherein the peripheral portion has a substantially constant annular width around a circumference of the central portion.

7. The semiconductor package of claim 1, wherein the pad further comprises at least one vent hole passing through the peripheral portion in a laterally outward direction from the gap.

8. The semiconductor package of claim 7, wherein the pad comprises a first vent hole and a second vent directly opposing the first vent hole across the central portion.

9. A semiconductor package comprising:
a semiconductor chip;

a redistribution layer disposed on the semiconductor chip;
a pad disposed on and electrically connected to the redistribution layer; and
a connection member disposed on and electrically connected to the pad,
wherein the pad comprises a central portion and a first peripheral portion at least partially surrounding the central portion,
the central portion separated from the peripheral portion by a gap, and
the connection member physically contacts at least one of two side surfaces of the gap of the pad.

10. The semiconductor package of claim 9, wherein the connection member physically contacts both of the two side surfaces of the gap of the pad.

11. The semiconductor package of claim 9, wherein the connection member further physically contacts a portion of the redistribution layer exposed through the gap.

12. The semiconductor package of claim 9, wherein the pad further comprises:
a second peripheral portion at least partially surrounding the first peripheral portion,
the second peripheral portion separated from the first peripheral portion by a second gap, and
the connection member further contacts at least one side surface of the second gap.

13. The semiconductor package of claim 9, wherein a planar area of the redistribution layer is greater than a planar area of the semiconductor chip.

14. A semiconductor package comprising:
a semiconductor chip;
a first insulating layer disposed on the semiconductor chip and including a first opening exposing a portion of the semiconductor chip;
a first conductive pattern disposed on the first insulating layer in contact with the semiconductor chip through the first opening of the first insulating layer;
a second conductive pattern electrically connected to the first conductive pattern;
a second insulating layer disposed on the second conductive pattern and including a second opening exposing a portion of the second conductive pattern;
a pad disposed on the second insulating layer in contact with the second conductive pattern through the second opening in the second insulating layer; and
a connection member disposed on and electrically connected to the pad,
wherein the pad comprises a central portion and a peripheral portion at least partially surrounding the central portion,
the central portion separated from the peripheral portion by a gap, and
the connection member fills at least a portion of the gap of the pad.

15. The semiconductor package of claim 14, wherein the gap is disposed outside the second opening of the second insulating layer.

16. The semiconductor package of claim 14, wherein a width of the gap ranges from about 10 μm to about 50 μm.

17. The semiconductor package of claim 14, wherein the central portion and the peripheral portion each comprise copper (Cu).

18. The semiconductor package of claim 14, further comprising a wetting layer between the pad and the connection member.

19. The semiconductor package of claim 18, wherein the wetting layer comprises gold (Au).

20. The semiconductor package of claim 18, wherein the wetting layer is disposed on a top surface and an outer side surface of the central portion and on a top surface, an inner side surface, and an outer side surface of the peripheral portion.

* * * * *